United States Patent [19]
Kässer et al.

[11] Patent Number: 5,561,716
[45] Date of Patent: Oct. 1, 1996

[54] DEMODULATOR

[75] Inventors: Jürgen Kässer, Diekholzen; Stefan Bartels, Bienenbüttel, both of Germany

[73] Assignee: Blaupunkt-Werke GmbH, Hildesheim, Germany

[21] Appl. No.: 343,385

[22] Filed: Nov. 22, 1994

[30] Foreign Application Priority Data

Nov. 24, 1993 [DE] Germany .................. 43 40 012.4

[51] Int. Cl.$^6$ ............................................. H04H 5/00
[52] U.S. Cl. ........................... 381/15; 381/16; 455/324; 455/337; 329/347; 329/348
[58] Field of Search ................... 381/15, 16; 455/324, 455/337; 331/20, 25; 370/20; 375/261, 320; 329/347, 348

[56] References Cited

U.S. PATENT DOCUMENTS

| | | | |
|---|---|---|---|
| 4,172,966 | 10/1979 | Parker et al. | 381/15 |
| 4,184,046 | 1/1980 | Parker | 381/16 |
| 4,185,171 | 1/1980 | Parker | 381/16 |
| 4,278,839 | 7/1981 | Marik | 381/15 |
| 4,426,728 | 1/1984 | Kahn | 381/15 |
| 4,872,207 | 10/1989 | Ecklund | 381/15 |
| 5,239,699 | 8/1993 | Ecklund | 381/15 |

Primary Examiner—Forester W. Isen
Assistant Examiner—Duc Nguyen
Attorney, Agent, or Firm—Kenyon & Kenyon

[57] ABSTRACT

In a demodulator for a stereo signal transmitted by amplitude and phase modulation of a carrier, a phase signal and a quantity signal are formed. By multiplication of the quantity signal with the tangent of the phase signal reduced by a value to be preset, a difference signal is formed. The value to be preset is generated in such a way as to minimize the direct portion of the difference signal.

11 Claims, 2 Drawing Sheets

DEMODULATOR

FIELD OF THE INVENTION

The present invention relates to a demodulator for a stereo signal transmitted by amplitude and phase modulation of a carrier.

BACKGROUND INFORMATION

For the transmitting of stereo signals over medium-wave transmitters, the so-called C-quam standard is known, in which the quantity of the modulated signal depends on the sum signal (L+R), while the difference signal and the pilot tone are transmitted as phase modulation.

SUMMARY OF THE INVENTION

An object of the present invention is to provide a demodulator for such modulated signals which can be advantageously developed with digital circuits.

The amplitude-modulated signal is mixed with an oscillator signal to form baseband quadrature components. From these quadrature components, magnitude and phase signals are formed using the Cordic algorithm. A difference signal, being the quantity signal minus the tangent of the difference between the phase signal and a value to be preset, is formed. The quantity signal and difference signal are fed via high-pass filters to a matrix circuit, which forms the left-channel and right-channel signals.

The difference signal will have a direct portion (zero-frequency component) due to slight differences between the oscillator frequency and the amplitude-modulated signal's carrier frequency. The value to be preset is generated in such a way as to eliminate this component.

DETAILED DESCRIPTION OF THE DRAWINGS

Figure 1:
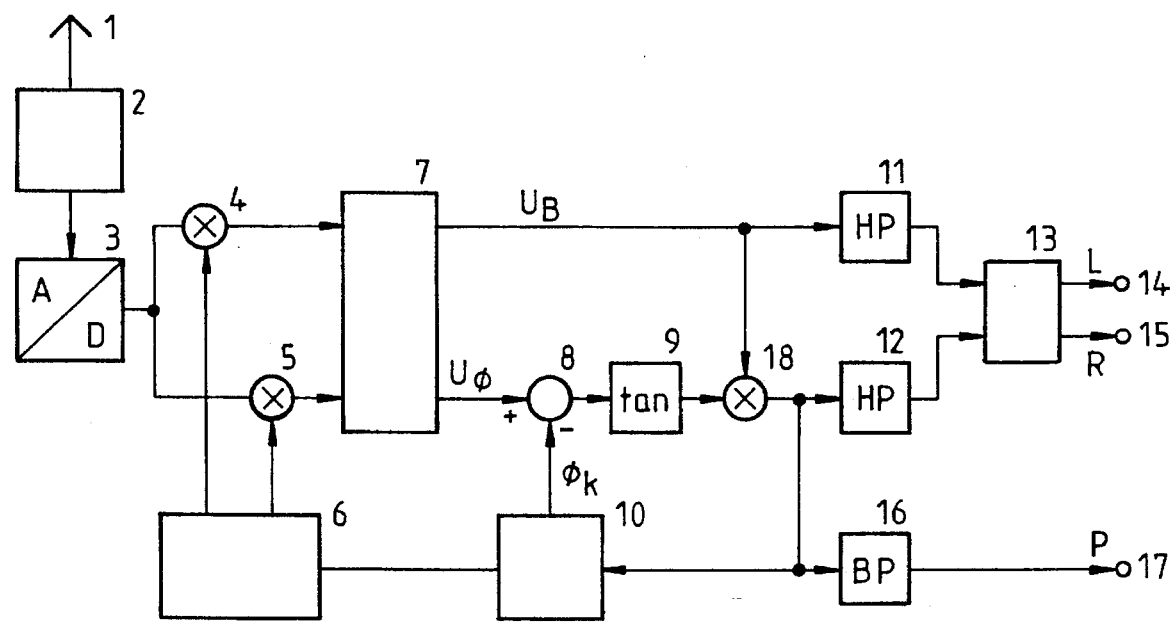
FIG. 1 is a block diagram of a preferred embodiment of the demodulator of the present invention.

In the embodiment shown in FIG. 1, a high-frequency AM-stereo signal is received from an antenna 1. This signal, in accordance with the C-Quam standard, has the form:

$$U=U_0[1+L+R]\cos\{2\pi ft+\arctan[(L-R+P)/(1+L+R)]\},$$

wherein $U_0$ is the voltage proportional to the field strength, L is the signal of the left channel, and R the signal of the right channel, both signals being less than 1, f is the carrier frequency, and P is the pilot tone preferably at 25 Hz.

This signal is fed to a reception part 2 which includes known elements such as prestages, mixer and selection means, so that there is present at the output an IF signal which is converted into a digital signal by means of a known analog/digital converter 3.

This signal is brought down into the baseband by means of two multipliers 4, 5, for which purpose a mix signal is fed from an oscillator 6 to the multipliers 4, 5, shifted by 90°. In this way, the quadrature components I and Q are produced in the baseband:

$$I=U_0[1+L+R]\cos\{\Phi+\arctan[(L-R+P)/(1+L+R)]\}, \text{ and}$$

$$Q=U_0[1+L+R]\sin\{\Phi+\arctan[(L-R+P)/(1+L+R)]\},$$

wherein $\Phi$ is the phase difference between the carrier and the oscillator. By means of a known amplitude control, $U_0$ can be set to a constant value, for instance 1.

In an alternative embodiment of the present invention, not shown, the quadrature components I and Q are produced from the received (analog) signal, and then I and Q are digitized by known analog/digital converters.

The quadrature components I and Q are converted into a quantity signal $U_B$ and a phase signal $U_\Phi$ in a Cordic demodulator 7. The signals $U_B$ and $U_\Phi$ produced by the Cordic demodulator are then:

$$U_B=1+L+R, \text{ and}$$

$$U_\Phi=\Phi+\arctan[(L-R+P)/(1+L+R)].$$

In order to obtain the difference signal, the following signal is formed:

$$\begin{aligned} U_T &= U_B \cdot \tan(U_\Phi - \Phi_k) = (1+L+R)\tan \\ &\quad \{\Phi - \Phi_k + \arctan[(L-R+P)/(1+L+R)] \\ &= (1+L+R) \cdot \{[\tan\{\Phi - \Phi_k\} + \\ &\quad (L-R+P)/(1+L+P)]/+ \\ &\quad [1-\tan(\Phi - \Phi_k) \cdot (L-R+P)/(1+L+P)]\} \end{aligned}$$

This signal has a direct portion which is approximately proportional to $\tan(\Phi_0-\Phi_k)$. By low-pass filtration of the signal $U_T$ and variation of $\Phi_k$ this direct portion can be made equal to 0 and one obtains $U_T=L-R+P$.

In order to carry out these operations, a subtractor 8, a tangent former 9, and an arithmetic unit 10 are provided in the embodiment shown in FIG. 1. The arithmetic unit 10 varies the value to be preset $\Phi_k$ in such a manner that the direct portion of $U_T$ is compensated for.

$U_B$ and $U_T$ are each then fed via a high-pass filter 11, 12 in known manner to a matrix 13 for forming the signals L and R, which can be obtained at the outputs 14, 15.

$U_T$ is furthermore conducted over a bandpass filter 16 having a middle frequency of 25 Hz, whereby the pilot tone P is selected, which can be taken off at an output 17.

Figure 2:
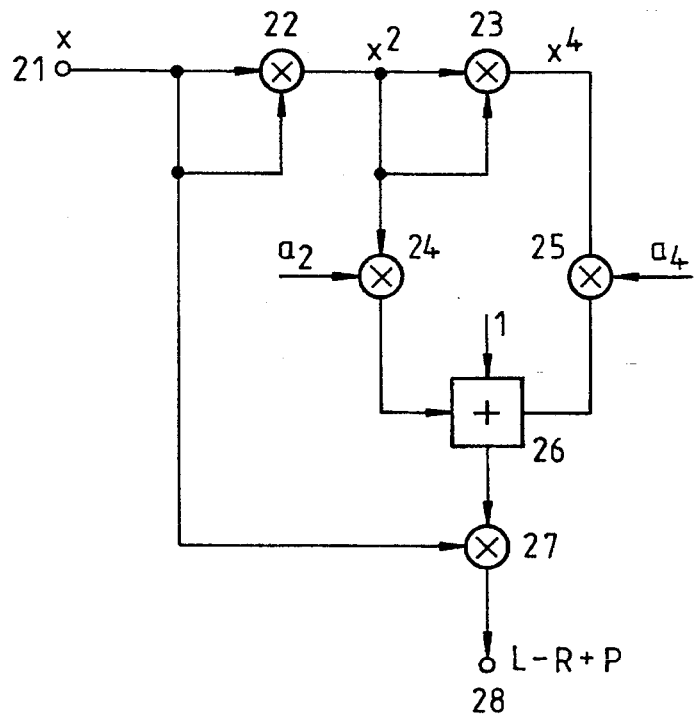
FIG. 2 is a block diagram of a preferred embodiment of a means for forming the tangent of a signal, which can be used in the embodiment of FIG. 1.

FIG. 2 illustrates one advantageous embodiment of the tangent former 9. Since the maximum phase angle is arctan $[(L-R+P)/(1+L+R)] \leq \pi/4$, it is sufficient to calculate the fifth-order polynomial expansion of the tangent function, with terms of the first, third and fifth power of the input signal x fed at 21 by the subtractor 8. This signal is squared at 22. The result $x^2$ is also squared at 23 so that $x^4$ is produced. $x^2$ and $x^4$ are weighted with the known coefficients of the polynomial expansion of tan(x), $a_2$ and $a_4$, and fed to an adder 26. The result of the addition is multiplied at 27 by the input signal x so that L–R+P is present at the output 28.

Figure 3:
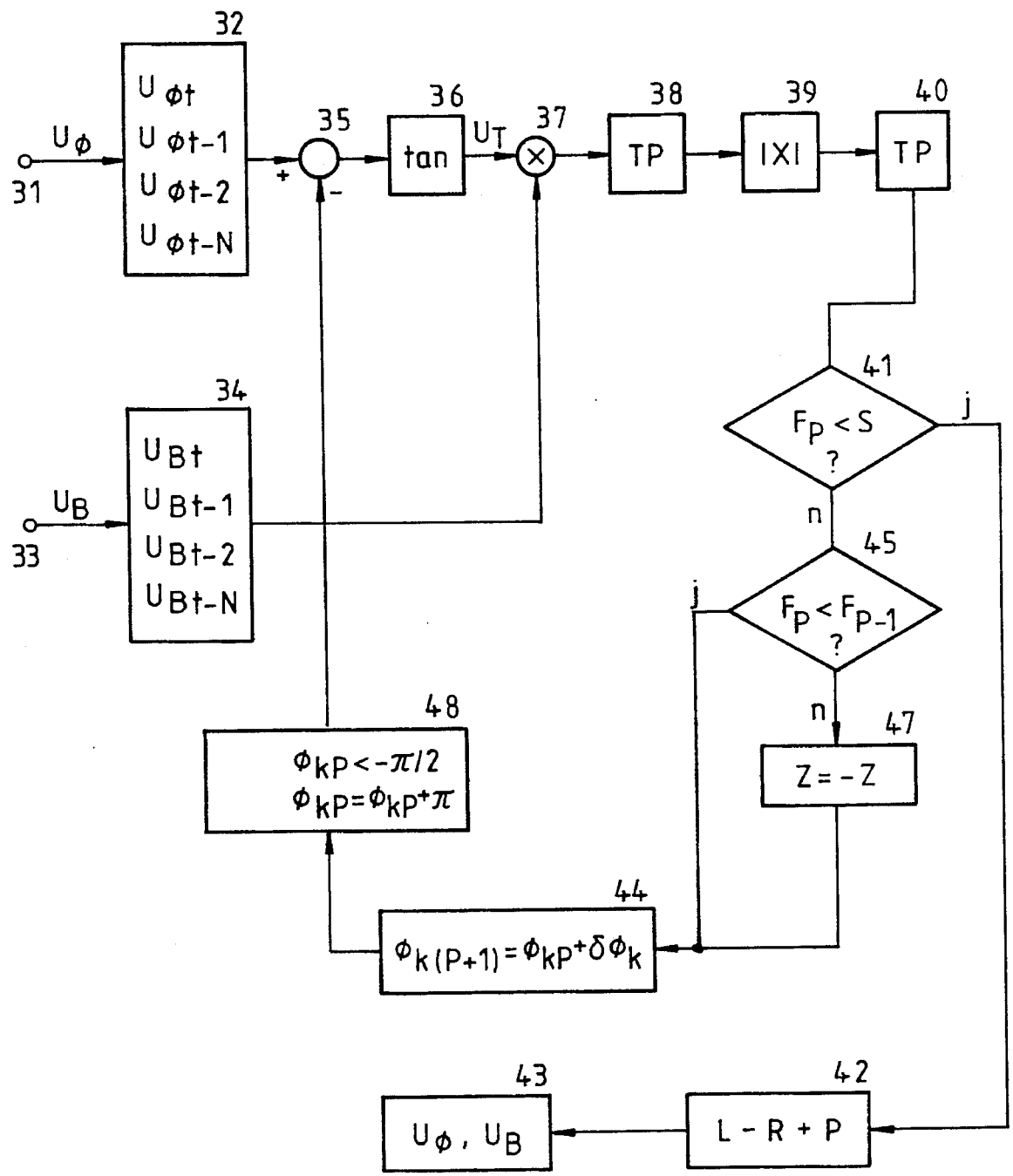
FIG. 3 is a block diagram of a means for the formation of the value to be preset, which can be used in the embodiment of FIG. 1.

FIG. 3 shows an embodiment of the arithmetic unit 10. The phase signal $U_\Phi$ is fed via an input 31 to the arithmetic unit 10. At 32, N+1 sampled values of the signal $U_\Phi$ are intermediately stored. N+1 sampled values of the quantity signal $U_B$ fed at 33 are also provisionally stored at 34. At 35, the value to be preset $\Phi_k$ is subtracted from the corresponding sampled value of the phase signal $U_\Phi$. The result is fed to a tangent former 36 described in further detail in FIG. 2.

The individual sampled values of the signal $U_T$ thus produced are multiplied by the corresponding sampled values of the signal $U_B$ at 37. In this way, there is produced a signal L–R+P having a superimposed disturbance (which, however, is minimized by the determination of $\Phi_k$ described below). This signal is fed over a low-pass filter 38 which can be of known construction and is preferably operated with a clock frequency which corresponds to a multiple of the pilot frequency. Following the low-pass filter 38 there is a module 39 which determines the absolute value of the signal. Since a very accurate crystal oscillator is used to produce the carrier on the transmission end and the oscillator used for the mixing on the reception end also has only slight and slow frequency deviations, rapid changes in the error signal are caused by momentary disturbances and should not be employed in order to compensate for the direct portion. Therefore, in order to free the error signal from these momentary disturbances, a further low-pass filter 40 is provided. The sampled values of the output signal of the low-pass filter 40 are designated $F_p$, p being a counting variable which describes the number of passes in each minimization.

At 41, it is tested whether $F_p$ is less than a threshold value S. If so, the minimizing is concluded, since the remaining direct portion is less than a permissible value. Thereupon, the output signal of the multiplier L–R+P is sent out at 42, i.e. fed to the high-pass filter 12 (FIG. 1). A new set of values of $U_\Phi$ and $U_B$ is then entered in each case at 43.

However, if $F_p$ is not less than S, then a change in the value to be preset $\Phi_k$ takes place at 43. First of all, it is tested at 45 whether $F_p$ is less than the preceding sampled value $F_{p-1}$ of the error signal. If so, the sign of the change to be effected at 44 is retained 46. Otherwise, the sign is changed at 47. The step size upon a change of the value to be preset $\Phi_k$ is controlled as a function of the error signal $F_p$, so $\Phi_k$ will reach its proper value more quickly.

In the event of a persistent difference between the carrier frequency and the frequency of the oscillator signal, the value to be preset would become very large with time and reach a limit established by the design of the circuit. Furthermore, a correction of the phase signal by more than one period is not meaningful. Therefore, the value to be preset $\Phi_k$ is set back by $\pi$ at 48 if $\Phi_k$ exceeds the value $\pi/2$, i.e., if $\Phi_k < -\pi/2$, then $\Phi_k = \Phi_k + \pi$, if $\Phi_k > \pi/2$, then $\Phi_k = \Phi_k - \pi$.

The embodiment and parts thereof are shown in the form of block diagrams. However, this does not mean that the circuit arrangement of the present invention is limited to being developed with the use of individual circuits corresponding to the blocks.

The circuit arrangement of the present invention can be produced in particularly advantageous manner with the use of highly integrated circuits. In this connection, for instance, use may be made of a digital signal processor which, with suitable programming, carries out the processing steps shown in the block diagram. The circuit arrangement of the present invention, together with further circuit arrangements within an integrated circuit, can form essential parts of a radio receiver.

What is claimed is:

1. A demodulator for a received stereo signal transmitted by amplitude and phase modulation of a carrier, comprising:

means for forming a quantity signal and an uncompensated phase signal from the received stereo signal;

means for forming a compensated phase signal by subtracting a preset value from the uncompensated phase signal;

means for forming a tangent of the compensated phase signal;

means for forming a difference signal having a direct portion, wherein the tangent of the compensated phase signal is multiplied by the quantity signal; and means for determining the preset value so as to minimize the direct portion of the difference signal.

2. The demodulator according to claim 1, wherein the means for forming the quantity signal and the phase signal from the received stereo signal includes:

means for forming a digitized stereo signal from the received stereo signal;

means for forming digitized quadrature components, wherein the digitized stereo signal is mixed with at least one oscillator signal; and means for forming the quantity signal and the phase signal from the digitized quadrature components, wherein the Cordic algorithm is used.

3. The demodulator according to claim 1, wherein the means for forming the quantity signal and the phase signal from the received stereo signal includes:

means for forming analog quadrature components, wherein the received stereo signal is mixed with at least one oscillator signal; and means for forming digitized quadrature components from the analog quadrature components;

means for forming the quantity signal and the phase signal from the digitized quadrature components, wherein the Cordic algorithm is used.

4. The demodulator according to claim 1, further comprising means for forming a left-channel signal and a right-channel signal from the quantity signal and the difference signal, wherein the quantity signal is fed via a first high-pass filter to a matrix circuit, the difference signal is fed via a second high-pass filter to the matrix circuit, and the left-channel signal and the right-channel signal are outputs of the matrix circuit.

5. The demodulator according to claim 1, wherein the means for forming the preset value includes means for forming an error signal having a size, wherein the difference signal is multiplied by the quantity signal, passed through a first low-pass filter, and passed through a circuit for forming an absolute value.

6. The demodulator according to claim 5, wherein the means for forming the preset value further includes:

means for comparing the error signal with a threshold value;

means for changing the preset value, wherein if the error signal is greater than the threshold value, the preset value is changed by a step having a direction and a size, the direction of the step being determined by comparing the error signal with a prior error signal.

7. The demodulator according to claim 6, wherein the size of the step is determined by the size of the error signal.

8. The demodulator according to claim 1, wherein the preset value has an upper limit and a lower limit, and the demodulator further comprises:

means for subtracting from the preset value an amount equal to $\pi$ when the preset value reaches the upper limit; and means for adding to the preset value an amount equal to $\pi$ when the preset value reaches the lower limit.

9. The demodulator according to claim 5, wherein the means for forming the error signal includes a second low-pass filter coupled to the circuit for forming the absolute value.

10. The demodulator according to claim 1, wherein the means for forming the tangent of the compensated phase signal calculates a fifth-degree polynomial.

11. The demodulator according to claim 5, wherein the received stereo signal includes a pilot signal having a frequency, and the first low-pass filter includes a digital circuit having a clock frequency which is a multiple of the frequency of the pilot signal.

* * * * *